US008637971B2

(12) United States Patent
Yoshida (10) Patent No.: US 8,637,971 B2
(45) Date of Patent: Jan. 28, 2014

(54) SEMICONDUCTOR DEVICE AND METHOD OF MANUFACTURING SEMICONDUCTOR DEVICE

(71) Applicant: Hiroshi Yoshida, Tokyo (JP)

(72) Inventor: Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/738,578

(22) Filed: Jan. 10, 2013

(65) Prior Publication Data

US 2013/0277819 A1 Oct. 24, 2013

(30) Foreign Application Priority Data

Apr. 20, 2012 (JP) .................................. 2012-096384

(51) Int. Cl.
*H01L 23/22* (2006.01)
*H01L 23/24* (2006.01)

(52) U.S. Cl.
USPC ............ 257/687; 257/729; 438/125; 438/126

(58) Field of Classification Search
USPC .......... 257/678, 687, 729, 787; 438/106, 124, 438/125, 126
See application file for complete search history.

(56) References Cited

U.S. PATENT DOCUMENTS

| 2007/0246833 | A1* | 10/2007 | Soga et al. ..................... 257/772 |
| 2007/0284719 | A1* | 12/2007 | Shiota et al. .................. 257/687 |
| 2008/0017882 | A1* | 1/2008 | Nakanishi et al. ............ 257/177 |
| 2010/0055845 | A1* | 3/2010 | Ikawa et al. ................... 438/123 |
| 2010/0128441 | A1 | 5/2010 | Soda et al. |
| 2010/0133681 | A1 | 6/2010 | Oka et al. |
| 2012/0319260 | A1* | 12/2012 | Kim et al. ..................... 257/676 |
| 2013/0056883 | A1* | 3/2013 | Furukawa ..................... 257/782 |

FOREIGN PATENT DOCUMENTS

| JP | 2010-087002 A | 4/2010 |
| JP | 2010-129797 A | 6/2010 |
| WO | 2008/142758 A1 | 11/2008 |
| WO | 2008/142759 A1 | 11/2008 |

* cited by examiner

*Primary Examiner* — Sheila V. Clark
(74) *Attorney, Agent, or Firm* — Studebaker & Brackett PC (57) ABSTRACT

A semiconductor device includes a housing made of a thermoplastic resin and having an internal space that is opened on one side and an inner wall portion that has an inner peripheral surface defining the internal space; and a core portion engaged in the internal space of the housing. The core portion includes a substrate, a semiconductor element mounted on the substrate, a wire electrically connecting the substrate and the semiconductor element, and a mold resin sealing the substrate, the semiconductor element and the wire. The core portion has a side surface provided with a convex portion that is in contact with the inner peripheral surface of the inner wall portion. Accordingly, a semiconductor device allowing a lengthened life and improved productivity, and a method of manufacturing the semiconductor device can be provided.

8 Claims, 6 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing the semiconductor device.

2. Description of the Background Art

Power modules are used for motor control of industrial devices and consumer devices. In the conventional general power module, a substrate having a semiconductor element mounted thereon and a casing made of a thermoplastic resin and used as a housing are bonded with an adhesive or the like. Also, the space within the casing and above the semiconductor element is sealed with silicone gel or the like. Furthermore, the semiconductor element and the circuit wiring on the substrate are connected via wire bond connection.

In the method of manufacturing this power module, an adhesive is applied to a substrate or a casing, and hardened to bond the substrate and the casing to each other. Then, the space within the casing is sealed with silicone gel or the like.

Furthermore, for example, Japanese Patent Laying-Open No. 2010-129797 proposes a power semiconductor device in which a power semiconductor module sealed with a transfer mold resin is set in an insert case. In this power semiconductor device, the first and second external terminals provided in the ceiling portion of the insert case are inserted into a cylindrical conductive body of the power semiconductor module, so that the power semiconductor module is set in the insert case.

Furthermore, for example, Japanese Patent Laying-Open No. 2010-087002 proposes a heat-generating component cooling structure in which a semiconductor module is installed in a cooling case. In this heat-generating component cooling structure, a protruding portion of the semiconductor module is inserted into the opening of the cooling case so as to ensure the sealing properties.

In the conventional general power module, the bonding portion between the semiconductor element and the wire is cut by thermal stress caused by thermal expansion and thermal contraction of silicone gel, which causes a problem that the life of the power module may be shortened.

Furthermore, according to this method of manufacturing a power module, an adhesive is applied to a substrate or a casing, and hardened to bond the substrate and the casing to each other, and then, the space within the casing is sealed with silicone gel, which causes a problem that the number of processes is increased. There is also a problem that the manufacturing cost is also increased. Furthermore, in order to prevent silicone gel from leaking to the outside of the casing from the portion where the adhesive is not applied, it is necessary to apply an adhesive to the entire periphery of the substrate without having any gap left thereon. This causes a problem of taking much time and effort, which also leads to a problem that productivity is decreased.

Furthermore, in the power semiconductor device disclosed in Japanese Patent Laying-Open No. 2010-129797, it is necessary to form the first and second external terminals in a press-fit structure so as to be inserted into the cylindrical conductive body. This causes a problem that productivity is decreased.

Furthermore, in the heat-generating component cooling structure disclosed in Japanese Patent Laying-Open No. 2010-087002, it is necessary to provide an opening in the cooling case and a protruding portion in the semiconductor module. Furthermore, since the protruding portion is inserted into the opening so as to ensure the sealing properties, the opening and the protruding portion are joined to each other through surface contact. This makes it difficult to insert the protruding portion into the opening, which leads to a problem that productivity is decreased.

SUMMARY OF THE INVENTION

The present invention has been made in light of the above-described problems. An object of the present invention is to provide a semiconductor device allowing a lengthened life and improved productivity, and a method of manufacturing the semiconductor device.

A semiconductor device of the present invention includes a housing made of a thermoplastic resin and having an internal space that is opened on one side and an inner wall portion that has an inner peripheral surface defining the internal space; and a core portion engaged in the internal space of the housing. The core portion includes a substrate; a semiconductor element mounted on the substrate; a wire electrically connecting the substrate and the semiconductor element; and a mold resin sealing the substrate, the semiconductor element and the wire. The core portion has a side surface provided with a convex portion that is in contact with the inner peripheral surface of the inner wall portion.

According to the semiconductor device of the present invention, the core portion includes a mold resin sealing the substrate, the semiconductor element and the wire. The mold resin has a linear expansion coefficient less than that of a silicone gel, which leads to reduction in thermal stress that is caused by thermal expansion and thermal compression. Since the substrate, the semiconductor element and the wire are sealed with a mold resin in the core portion, it becomes possible to suppress cutting of the bonding portion between the semiconductor element and the wire due to thermal stress. Consequently, a lengthened life can be achieved.

Furthermore, the core portion has a side surface provided with a convex portion that is in contact with the inner peripheral surface of the inner wall portion. Accordingly, the core portion can be held by the housing by bringing the convex portion into contact with the inner peripheral surface. It also becomes possible to decrease the area of the core portion in contact with the inner peripheral surface of the inner wall portion as compared with the case where the convex portion is not provided. This allows a decrease in contact resistance, so that the core portion can be readily engaged in the internal space. Therefore, productivity can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be hereinafter described with reference to the accompanying drawings.

The configuration of a semiconductor device according to one embodiment of the present invention will be first described.

Figure 1:
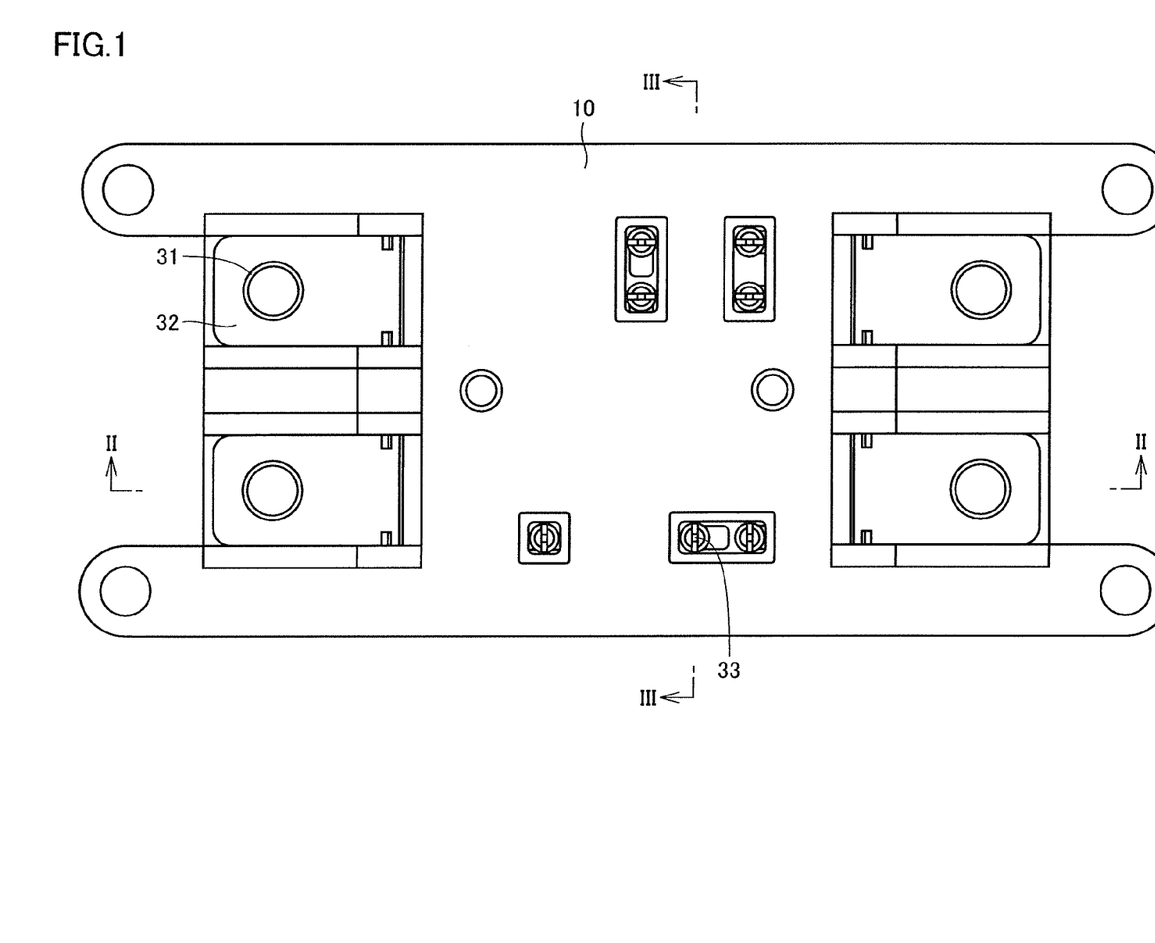
FIG. 1 is a schematic top plan view of a semiconductor device in one embodiment of the present invention.
Figure 2:
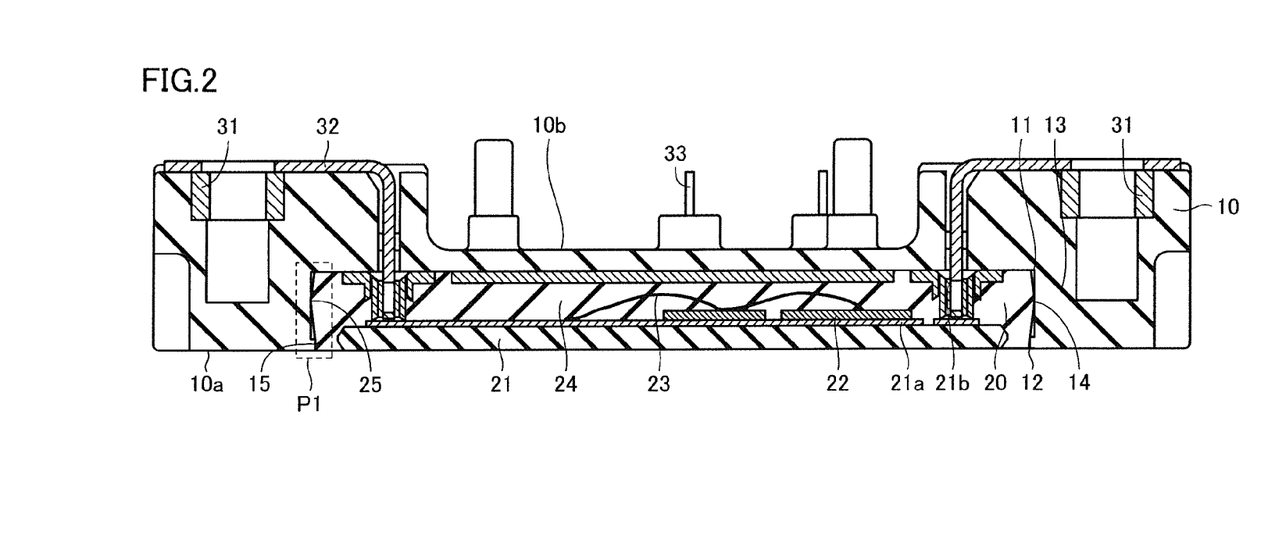
FIG. 2 is a schematic cross-sectional view taken along a line II-II in FIG. 1.
Figure 3:
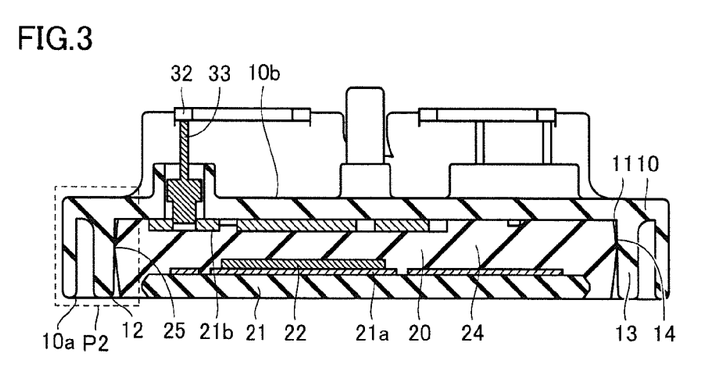
FIG. 3 is a schematic cross-sectional view taken along a line III-III in FIG. 1.

Referring to FIGS. 1 to 3, the semiconductor device of the present embodiment is a power module, for example. The semiconductor device of the present embodiment mainly includes a housing 10, a core portion 20, a nut 31, an electrode terminal 32, and a signal terminal 33.

Housing 10 has core portion 20 provided on one side, and also has nut 31, electrode terminal 32 and signal terminal 33 provided on the other side. Core portion 20 is attached to housing 10 so as to be exposed from a lower surface 10a of housing 10. Electrode terminal 32 is attached to housing 10 so as to be electrically connected to nut 31 and exposed from an upper surface 10b of housing 10. Furthermore, signal terminal 33 is attached to housing 10 so as to protrude from upper surface 10b of housing 10.

Figure 4:
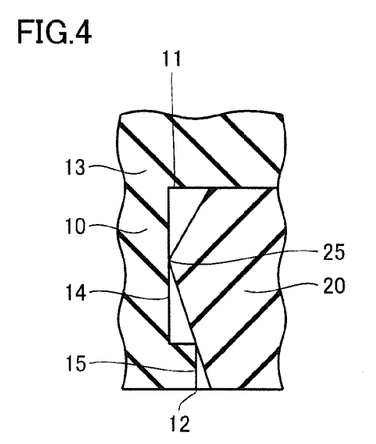
FIG. 4 is an enlarged view showing an area of P1 in FIG. 2.

Referring to FIGS. 2 and 4, housing 10 includes an internal space 11, an inner wall portion 13 and a protruding portion 15. Housing 10 is made of a thermoplastic resin. This thermoplastic resin has a bending elastic modulus less in value than the bending elastic modulus of a mold resin 24 described later. Housing 10 is configured so as to be elastically deformable in the state where core portion 20 is fit thereinto. A thermoplastic resin to be used may be PPS (polyphenylene sulfide), for example. This PPS has a bending elastic modulus (coefficient of bending elasticity) of 18 GPa, for example.

The concave portion provided in the center of housing 10 corresponds to internal space 11. Internal space 11 is opened on one side. An opening 12 is provided at an end of internal space 11 on one side. Inner wall portion 13 is provided so as to surround internal space 11. Inner wall portion 13 has an inner peripheral surface 14 defining internal space 11. The space surrounded by inner peripheral surface 14 corresponds to internal space 11.

Inner wall portion 13 has protruding portion 15 protruding from inner peripheral surface 14. Protruding portion 15 is formed so as to overlap the side surface of core portion 20 as seen from the upper surface 10b side of housing 10. Protruding portion 15 may be provided at the lower end of inner wall portion 13.

Core portion 20 is engaged in internal space 11 of housing 10. Core portion 20 has an upper surface and a side surface covered by housing 10, and also has a lower surface exposed from housing 10. Core portion 20 has a substrate 21, a semiconductor element 22, a wire 23, and a mold resin 24.

Substrate 21 has a circuit 21a and a connecting portion 21b. Circuit 21a is disposed on the upper surface of substrate 21. Connecting portion 21b is electrically connected to circuit 21a and exposed from the upper surface of core portion 20. Connecting portion 21b is configured so as to contact an electrode terminal 32 and a signal terminal 33. Electrode terminal 32 and signal terminal 33 are brought into contact with connecting portion 21b, thereby establishing circuit connection of electrode terminal 32 and signal terminal 33 to substrate 21 within core portion 20. The lower surface of substrate 21 is exposed from mold resin 24.

Semiconductor element 22 is mounted on substrate 21. Examples of semiconductor element 22 may be an IGBT (Insulated Gate Bipolar Transistor), a MOSFET (Metal Oxide Semiconductor Field Effect Transistor) and the like. Semiconductor element 22 is, for example, soldered to circuit 21a. Wire 23 electrically connects substrate 21 and semiconductor element 22. Semiconductor element 22 and circuit 21a of substrate 21 are wire-bonded to each other. Wire 23 is, for example, an aluminum wire. Mold resin 24 seals substrate 21, semiconductor element 22 and wire 23. Core portion 20 is transfer-molded with mold resin 24.

Core portion 20 has a convex portion 25 on its side surface. Convex portion 25 is provided so as to extend from the side surface toward outside. Convex portion 25 is provided so as to protrude more in the center area than in both ends as seen in the thickness direction of core portion 20. Convex portion 25 may be provided so as to protrude most in the portion closer to the upper surface or the lower surface with respect to the center as seen in the thickness direction of core portion 20. Convex portion 25 may be provided so as to have the greatest length dimension in the portion closer to the upper surface with respect to the center as seen in the thickness direction of core portion 20. Convex portion 25 may have a triangular cross-sectional shape.

Convex portion 25 is in contact with inner peripheral surface 14 of inner wall portion 13. Convex portion 25 is in contact at its part of the area in the thickness direction with inner peripheral surface 14. Convex portion 25 is provided such that it can press on inner peripheral surface 14 while being in contact with inner peripheral surface 14.

Protruding portion 15 is provided such that convex portion 25 is sandwiched between this protruding portion 15 and inner peripheral surface 14 located on the opposite side of opening 12. Protruding portion 15 is disposed closer to lower surface 10a of housing 10 with respect to convex portion 25. As seen from the lower surface 10a side of housing 10, protruding portion 15 is provided so as to overlap convex portion 25. Protruding portion 15 may be in contact with convex portion 25.

Again referring to FIGS. 2 and 3, convex portion 25 is formed on each of four side surfaces of core portion 20. At each of four side surfaces of core portion 20, convex portion 25 is in contact with inner peripheral surface 14. It is to be noted that convex portion 25 may be continuously formed on every side surface of core portion 20. Furthermore, convex portion 25 only has to be in contact with inner peripheral surface 14 and may be formed only on a part of the side surface of core portion 20.

Figure 5:
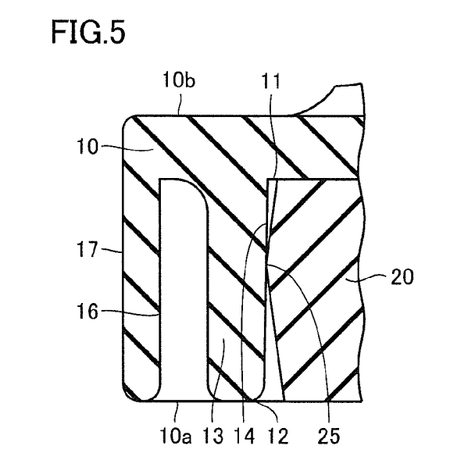
FIG. 5 is an enlarged view of showing an area of P2 in FIG. 3.

Referring to FIGS. 3 and 5, housing 10 has a groove portion 16 provided so as to extend from lower surface 10a to upper surface 10b. Groove portion 16 is provided in housing 10 between an outer peripheral end face 17 and inner wall portion 13. Groove portion 16 may be formed so as to surround internal space 11. Furthermore, groove portion 16 may be formed so as to surround a part of internal space 11. Groove portion 16 provides a space on the outside of inner wall portion 13. This allows inner wall portion 13 to be readily deformed in the direction of groove portion 16.

Figure 6:
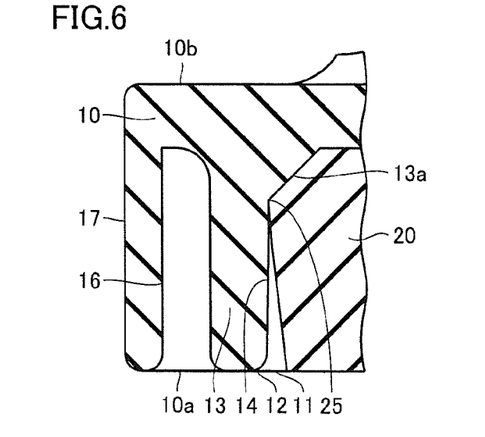
FIG. 6 is a schematic enlarged cross-sectional view of a modification of the semiconductor device in one embodiment of the present invention, shown in cross section in FIG. 5.

Further referring to FIG. 6, in the modification of the present embodiment, inner wall portion 13 has a tapered portion 13a. Tapered portion 13a is formed to have a cross-sectional area that is reduced starting from the base portion of inner wall portion 13 toward the end thereof. Furthermore, it is preferable that tapered portion 13a is formed on the internal space 11 side. Consequently, it becomes possible to increase elasticity of inner wall portion 13 toward internal space 11.

The method of manufacturing the semiconductor device according to the present embodiment will then be described.

Figure 7:
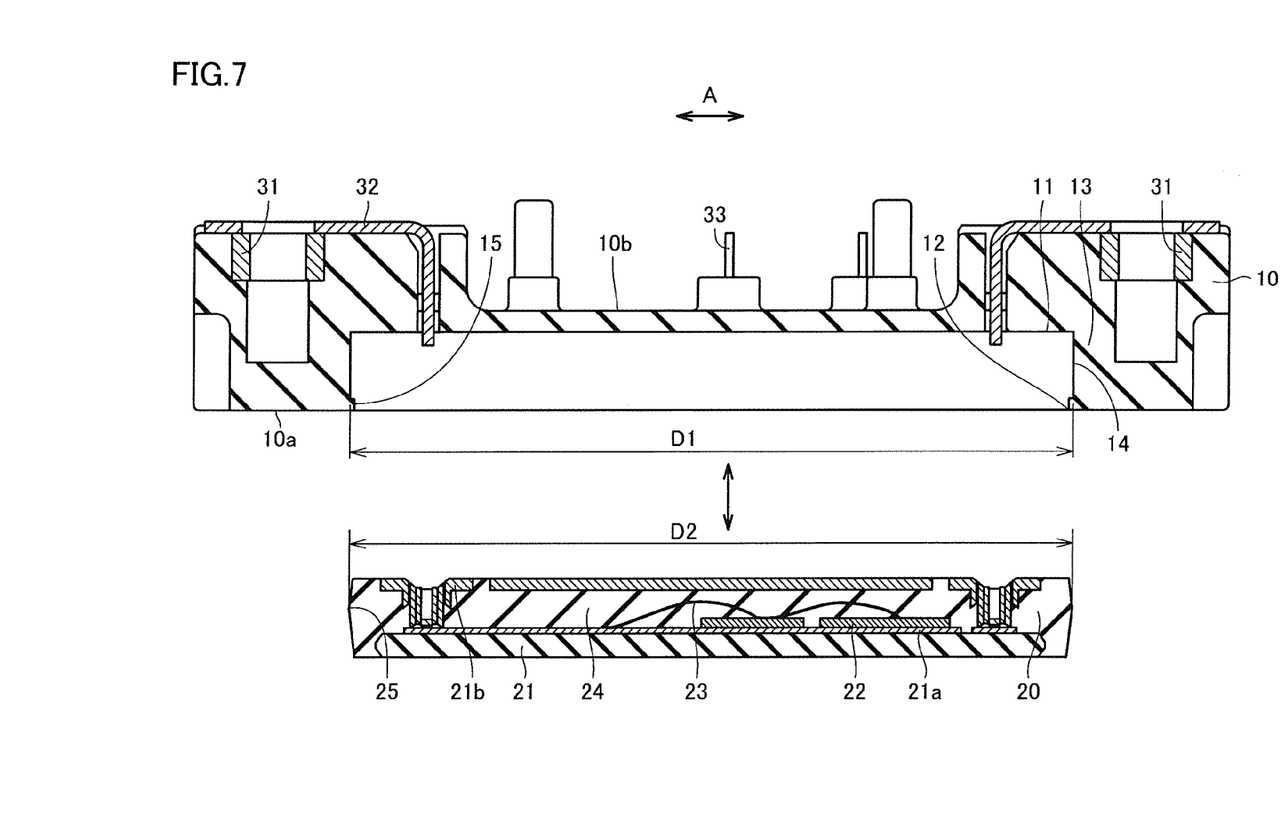
FIG. 7 is a schematic cross-sectional view illustrating a method of manufacturing the semiconductor device in one embodiment of the present invention.

Referring to FIG. 7, housing 10 as described above is prepared in the method of manufacturing the semiconductor device of the present embodiment. Nut 31, electrode terminal 32 and signal terminal 33 are attached to housing 10.

Then, core portion 20 described above is engaged in internal space 11 of housing 10. Core portion 20 is inserted into internal space 11 through opening 12. In this case, core portion 20 is inserted such that a portion of convex portion 25 having a relatively low height is first inserted into internal space 11. This allows core portion 20 to be readily inserted into internal space 11. Then, convex portion 25 is brought into contact with inner peripheral surface 14 of inner wall portion 13. Since convex portion 25 is in contact with inner peripheral surface 14, the contact area between the side surface of core portion 20 and internal space 11 becomes small. This allows core portion 20 to be readily engaged in internal space 11. Furthermore, when core portion 20 is inserted into internal space 11, electrode terminal 32 and signal terminal 33 each are brought into contact with connecting portion 21b, to establish electrical connection therebetween.

Furthermore, core portion 20 having a dimension greater than the length of internal space 11 in the direction in contact with inner peripheral surface 14 may be engaged in internal space 11. Specifically, a length dimension D2 of core portion 20 may be greater than a length dimension D1 of internal space 11 in the direction in which convex portion 25 of core portion 20 is brought into contact with inner peripheral surface 14 (the direction indicated by an arrow A in the figure). This allows interference fit of core portion 20 into internal space 11. Therefore, core portion 20 is securely held by the elasticity of inner wall portion 13.

Then, the functions and effects of the present embodiment will be described in comparison with a comparative example.

Figure 8:
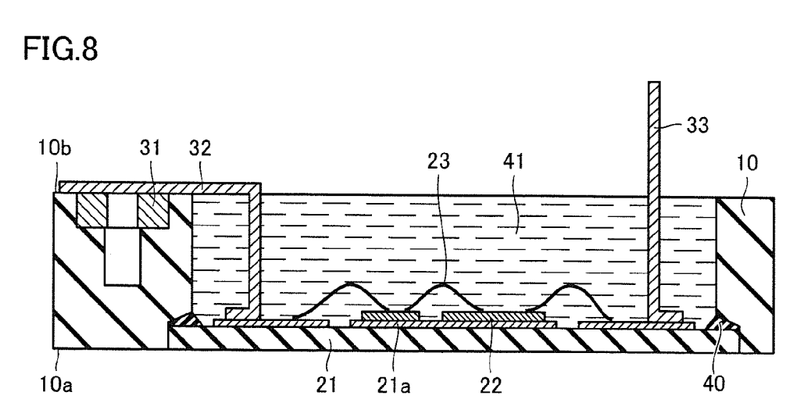
FIG. 8 is a schematic cross-sectional view of a semiconductor device in a comparative example.

Referring to FIG. 8, in the semiconductor device of the comparative example, semiconductor element 22 is mounted on circuit 21a of substrate 21. Circuit 21a of substrate 21 and semiconductor element 22 are connected via wire bond connection using wire 23. Substrate 21 is bonded in its outer peripheral portion to housing 10 made of a thermoplastic resin with an adhesive 40. The space within housing 10 is sealed with silicone gel 41. Substrate 21 is disposed on the lower surface 10a side of housing 10. Nut 31 is disposed on the upper surface 10b side of housing 10. Electrode terminal 32 is provided so as to electrically connect nut 31 and circuit 21a to each other. Signal terminal 33 is electrically connected to circuit 21a.

In the semiconductor device of the comparative example, the bonding portion between semiconductor element 22 and wire 23 is cut due to thermal stress caused by thermal expansion and thermal contraction of silicone gel 41, which leads to a shortened life of the semiconductor device.

Furthermore, in the method of manufacturing the semiconductor device of the comparative example, adhesive 40 is applied to substrate 21 or housing 10, and hardened to bond substrate 21 and housing 10 to each other, and then, the space within housing 10 is sealed with silicone gel 41. This results in an increased number of processes. The manufacturing cost is also increased. Furthermore, in order to prevent silicone gel 41 from leaking to the outside of housing 10 from the portion where adhesive 40 is not applied, it is necessary to apply adhesive 40 to the entire periphery of substrate 21 without having any gap left thereon. This requires much time and effort, thereby decreasing productivity.

In contrast, according to the semiconductor device of the present embodiment, core portion 20 includes mold resin 24 sealing substrate 21, semiconductor element 22 and wire 23. Mold resin 24 has a linear expansion coefficient smaller than that of silicone gel, which leads to reduction in thermal stress that is caused by thermal expansion and thermal compression. The linear expansion coefficient of mold resin 24 is, for example, 17 ppm/K while the linear expansion coefficient of silicone gel is, for example, 1000 ppm/K. In addition, the linear expansion coefficient of wire 23 is, for example, 23 ppm/K. Since substrate 21, semiconductor element 22 and wire 23 are sealed with mold resin 24 in core portion 20, it becomes possible to suppress cutting of the bonding portion between semiconductor element 22 and wire 23 due to thermal stress. Consequently, a lengthened life can be achieved.

Furthermore, core portion 20 has a side surface provided with convex portion 25 that is in contact with inner peripheral surface 14 of inner wall portion 13. Accordingly, convex portion 25 is brought into contact with inner peripheral surface 14, thereby allowing core portion 20 to be held by housing 10. Therefore, core portion 20 can be held by housing 10 by fitting core portion 20 into internal space 11 without using adhesive 40. Also, the core portion can be held with stability by fitting this core portion into the internal space to be held therein.

Furthermore, the area of the core portion in contact with inner peripheral surface 14 of inner wall portion 13 can be decreased as compared with the case where convex portion 25 is not provided. This allows a decrease in contact resistance, thereby allowing core portion 20 to be readily engaged in internal space 11. Therefore, productivity can be improved.

Furthermore, core portion 20 can be fit into internal space 11 without using adhesive 40, which allows core portion 20 to be readily attached to housing 10. Furthermore, since adhesive 40 is not used, core portion 20 can also be attached to housing 10 at a low cost.

Furthermore, housing 10 is made of a thermoplastic resin. The thermoplastic resin is higher in elasticity than mold resin 24. The elasticity of mold resin 24 is relatively low. Accordingly, when housing 10 is formed of mold resin 24 as with core portion 20, cracking may occur. For this reason, by forming housing 10 from a thermoplastic resin that is greater in elasticity than a mold resin, it becomes possible to suppress cracking of housing 10. Consequently, nut 31, electrode terminal 32, signal terminal 33, and the like can be readily fixed to housing 10.

Furthermore, according to the semiconductor device of the present embodiment, the bending elastic modulus of the thermoplastic resin is smaller in value than the bending elastic modulus of mold resin 24. Accordingly, when core portion 20 sealed with mold resin 24 is engaged in housing 10 made of a thermoplastic resin, housing 10 can be elastically deformed. Therefore, core portion 20 can be held by the elasticity of housing 10.

Furthermore, according to the semiconductor device of the present embodiment, protruding portion 15 protruding from inner peripheral surface 14 is provided such that convex portion 25 is sandwiched between this protruding portion 15 and inner peripheral surface 14 located on the opposite side of opening 12. Consequently, protruding portion 15 can prevent core portion 20 from falling from internal space 11.

Furthermore, according to the semiconductor device of the present embodiment, convex portion 25 is formed on each of four side surfaces of core portion 20. This allows convex portion 25 to be brought into contact with inner peripheral surface 14 on each of the four sides of core portion 20. Consequently, core portion 20 can be held further securely by housing 10.

According to the semiconductor device of the present embodiment, groove portion 16 provided in housing 10 so as to extend from lower surface 10a to upper surface 10b is provided in housing 10 between outer peripheral end face 17 and inner wall portion 13. Accordingly, inner wall portion 13 can be readily deformed in the direction of groove portion 16. Furthermore, since groove portion 16 is provided in housing 10 between outer peripheral end face 17 and inner wall portion 13, it becomes possible to prevent deformation of outer peripheral end face 17 of housing 10 when inner wall portion 13 is deformed in the direction of the groove portion. Consequently, the external dimensions of housing 10 can be maintained.

Furthermore, according to the semiconductor device of the present embodiment, inner wall portion 13 includes a tapered portion 13a formed to have a cross-sectional area that is reduced starting from the base portion of inner wall portion 13 itself toward the end thereof. Accordingly, the strength of inner wall portion 13 can be increased. This allows core portion 20 to be held further more securely by housing 10. Furthermore, due to tapered portion 13a, housing 10 can be readily extracted from the mold during molding of housing 10. Consequently, housing 10 can be molded in the mold having a simplified shape.

According to the method of manufacturing the semiconductor device of the present embodiment, the following steps are included. First prepared is housing 10 made of a thermoplastic resin and having an internal space 11 that is opened on one side and an inner wall portion 13 that has an inner peripheral surface 14 defining internal space 11. Core portion 20 is engaged in internal space 11 of housing 10. Core portion 20 includes substrate 21, semiconductor element 22 mounted on substrate 21, wire 23 electrically connecting substrate 21 and semiconductor element 22, and mold resin 24 sealing substrate 21, semiconductor element 22 and wire 23. Core portion 20 has a side surface provided with convex portion 25 that is in contact with inner peripheral surface 14 of inner wall portion 13.

Since substrate 21, semiconductor element 22 and wire 23 are sealed with mold resin 24 in core portion 20, it becomes possible to suppress cutting of the bonding portion between semiconductor element 22 and wire 23 due to thermal stress. Consequently, a lengthened life can be achieved.

Furthermore, convex portion 25 is brought into contact with inner peripheral surface 14, thereby allowing core portion 20 to be held by housing 10. Also, since the contact resistance can be decreased, core portion 20 can be readily engaged in internal space 11. Furthermore, the core portion can be engaged in internal space 11 such that a portion of the convex portion having a relatively low height is first inserted into internal space 11. This allows core portion 20 to be readily engaged in internal space 11. Therefore, productivity can be improved.

Furthermore, according to the method of manufacturing the semiconductor device of the present embodiment, core portion 20 has a dimension greater than the length of internal space 11 in the direction in which core portion 20 is brought into contact with inner peripheral surface 14, and this core portion 20 is engaged in internal space 11. This allows interference fit of core portion 20 into internal space 11. Consequently, core portion 20 can be securely fit into housing 10.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a housing made of a thermoplastic resin, and having an internal space that is opened on one side and an inner wall portion that has an inner peripheral surface defining said internal space; and
    a core portion engaged in said internal space of said housing,
    said core portion including
    a substrate,
    a semiconductor element mounted on said substrate, and
    a wire electrically connecting said substrate and said semiconductor element, and
    a mold resin sealing said substrate, said semiconductor element and said wire,
    said core portion having a side surface provided with a convex portion that is in contact with said inner peripheral surface of said inner wall portion.

2. The semiconductor device according to claim 1, wherein said thermoplastic resin has a bending elastic modulus that is less in value than the bending elastic modulus of said mold resin.

3. The semiconductor device according to claim 1, wherein said inner wall portion includes a protruding portion protruding from said inner peripheral surface, and
    said protruding portion is provided such that said convex portion is sandwiched between said protruding portion and said inner peripheral surface located on an opposite side of said opening.

4. The semiconductor device according to claim 1, wherein said convex portion is formed on each of four side surfaces of said core portion.

5. The semiconductor device according to claim 1, wherein said housing includes a groove portion provided to extend from a lower surface to an upper surface, and
    said groove portion is provided in said housing between an outer peripheral end face and said inner wall portion.

6. The semiconductor device according to claim 1, wherein said inner wall portion includes a tapered portion formed so as to have a cross-sectional area that is reduced starting from a base portion of the inner wall portion toward an end thereof.

7. A method of manufacturing a semiconductor device, said method comprising the steps of:
    preparing a housing made of a thermoplastic resin, and having an internal space that is opened on one side and an inner wall portion that has an inner peripheral surface defining said internal space; and
    engaging a core portion in said internal space of said housing,
    said core portion including
    a substrate,
    a semiconductor element mounted on said substrate,
    a wire electrically connecting said substrate and said semiconductor element, and
    a mold resin sealing said substrate, said semiconductor element and said wire,
    said core portion having a side surface provided with a convex portion that is in contact with said inner peripheral surface of said inner wall portion.

8. The method of manufacturing a semiconductor device according to claim 7, wherein said core portion has a dimension greater than a length of said internal space in a direction in which said core portion is in contact with said inner peripheral surface, and said core portion is engaged in said internal space.

* * * * *